(12) United States Patent
Abrosimov et al.

(10) Patent No.: US 7,278,069 B2
(45) Date of Patent: Oct. 2, 2007

(54) DATA TRANSMISSION APPARATUS FOR HIGH-SPEED TRANSMISSION OF DIGITAL DATA AND METHOD FOR AUTOMATIC SKEW CALIBRATION

(76) Inventors: Igor Anatolievich Abrosimov, Moskovsky prospect, 36-7, St. Petersburg (RU) 198013; Vasily Grigorievich Atyunin, 29/5-26, ul. Kosmonavtov, St. Petersburg (RU) 196211; Alexander Roger Deas, King's Gate Lodge, Edinburgh (GB) EH22 1ST; Ilya Vasilievich Klotchkov, 17-32, ul. Soldata Korzuna, St. Petersburg (RU) 198260

( * ) Notice: Subject to any disclaimer, the term of this patent is extended or adjusted under 35 U.S.C. 154(b) by 722 days.

(21) Appl. No.: 10/425,630

(22) Filed: Apr. 30, 2003

(65) Prior Publication Data

US 2003/0198309 A1    Oct. 23, 2003

Related U.S. Application Data

(63) Continuation-in-part of application No. PCT/RU01/00365, filed on Sep. 6, 2001.

(60) Provisional application No. 60/310,299, filed on Aug. 6, 2001, provisional application No. 60/244,179, filed on Oct. 31, 2000.

(30) Foreign Application Priority Data

Apr. 2, 2001    (GB)    ................................... 0111181.4

(51) Int. Cl.
*G06K 5/04* (2006.01)
*G06K 5/00* (2006.01)
*G11B 20/20* (2006.01)

(52) U.S. Cl. ........................ 714/700; 714/744; 713/503
(58) Field of Classification Search ................ 714/700, 714/744; 713/503; 307/409; 327/141, 292
See application file for complete search history.

(56) References Cited

U.S. PATENT DOCUMENTS

| | | | | |
|---|---|---|---|---|
| 4,731,676 | A * | 3/1988 | Berlekamp | 360/26 |
| 5,003,256 | A * | 3/1991 | Merrill | 714/814 |
| 5,313,501 | A | 5/1994 | Thacker | 375/117 |
| 5,369,640 | A * | 11/1994 | Watson et al. | 714/700 |
| 5,604,455 | A | 2/1997 | Bion et al. | 327/176 |
| 5,617,145 | A * | 4/1997 | Huang et al. | 348/423.1 |
| 5,717,729 | A * | 2/1998 | Iknaian et al. | 375/356 |
| 6,292,507 | B1 * | 9/2001 | Hardin et al. | 375/130 |
| 6,377,640 | B2 | 4/2002 | Trans | 375/354 |
| 6,420,915 | B2 | 7/2002 | Erickson | 327/141 |
| 6,477,659 | B1 * | 11/2002 | Ho | 713/503 |
| 6,756,775 | B2 * | 6/2004 | Jungerman | 324/121 R |
| 6,820,234 | B2 * | 11/2004 | Deas et al. | 714/814 |

* cited by examiner

*Primary Examiner*—Guy J. Lamarre

(57) ABSTRACT

A data transmission apparatus and method employing the phase noise characteristics within the receiving registers to measure and control the characteristics of the channel as a function of the data pattern and to compensate for production tolerances within the channel by altering the timing characteristics of the signal at either the transmitter or receiver as a function of the data. Time offsets between different signals that form the communication channel are measured for different frequencies and/or for different data patterns transmitted through the channel and stored to compensate for an inter-signal skew by performing relative alignment of the measured offsets to a main clock edge.

20 Claims, 5 Drawing Sheets

FIRST PULSE IS REDUCED BY 50% DUE TO DISCONTINUITY
SECOND PULSE IS ALSO REDUCED BY 50%,
BUT HAS THE ENERGY OF THE FIRST PULSE
ADDED TO IT AT A PARTICULAR POINT IN TIME.

IN REALITY, A MATRIX OF REFLECTIVE WAVE FRONTS ARE COMBINED.

DATA TRANSMISSION APPARATUS FOR HIGH-SPEED TRANSMISSION OF DIGITAL DATA AND METHOD FOR AUTOMATIC SKEW CALIBRATION

CROSS-REFERENCE TO RELATED APPLICATIONS

This application is a continuation-in-part application of PCT/RU01/00365 filed on Sep. 6, 2001, claiming priority from U.S. provisional application No. 60/244,179 filed on Oct. 31, 2000, GB application 0111181.4 filed Apr. 2, 2001 and U.S. provisional application No. 60/310,299 filed Aug. 6, 2001, all of which are incorporated herein by reference.

FIELD OF THE INVENTION

The present invention relates to the reduction of timing uncertainty in a high speed communications channel or interface.

More specifically, the present invention relates to a device and method employing the phase noise characteristics within the receiving registers to measure the characteristics of the channel as a function of the data pattern and to compensate for production tolerances within the channel by altering the timing characteristics of the signal at either the transmitter or receiver as a function of the data.

The present invention is particularly applicable to interfaces between integrated circuits and for high speed communications.

BACKGROUND OF THE INVENTION

The amount of data that can be communicated through a synchronous digital channel between two devices is limited by four fundamental factors:

1. The timing uncertainty characteristic of the channel.
2. The maximum rate at which the transmitting or receiving registers can toggle.
3. The speed at which the voltage or current that signals a logic state can switch between logic states.
4. The Process Gain: this is the $\log_2$ of the number of logic states that the channel can support, that is the number of bits per symbol. For example, a system with four logic states would have a Process Gain of two, as this represents two bits.

Considering each of these limits, it is apparent that:

1. The timing uncertainty is the combination or sum of the variation in the actual clock to output delay of the transmitter and the variation in the actual setup and hold time of the receiver plus the skew of the signals at the receiver in the case of a parallel channel having multiple wires or optical fibres.
2. The maximum rate at which the registers can toggle is determined by the technology in which the registers are implemented and the design and layout of the registers.
3. The speed at which the signal moves between logic states is a linear function of the slew rate of the signal and the noise margin, that is, the voltage or current step between states. In some instances, electronic systems can operate with voltage swings between states of as little as 80 mV, and even lower. The slew rate is a function both of the technology and of the power budget. Technologies such as GaAs and InPh (Indium Phosphide) exhibit very high electron mobilities, which allow large amounts of power to be applied in achieving a high slew rate, but the preferred approach is to maintain existing CMOS slew rates of around 2 V/ns while reducing the voltage swing between states, as this reduces the power needed to signal by the square of the reduction in voltage, assuming the system operates at its theoretical maximum frequency.

4. Process Gain: there is a strong relationship between limit 3 (time taken to move between states) and the potential for Process Gain: reducing the voltage swing between states so the system can move between states faster is using the SNR in the system to send more symbols in a given time, whereas the Process Gain uses the same SNR to pack in more states per transition, hence send more bits per symbol.

Concerning Channel Capacity, in The Bell System Technical Journal, V27, pp 379-423 and 623-656, October 1948, Claude Shannon establishes a fundamental limit for the amount of information that can be sent through a continuous channel affected by white noise with a Gaussian amplitude distribution. In that paper, the channel capacity is proven to be:

$$C = W \log 2(1+S/N)$$

where C=Channel capacity in bits per second, W=Bandwidth in Hertz, S=Signal Power, and N=Noise Power This capacity assumes infinite time to send the whole communication, that is infinite latency for the data. Modern modems get close to these theoretical limits, but the methods involved are completely impractical for a high speed system operating at the speed of digital systems such as processors, which are clocked at multi-GigaHertz speeds.

There have been numerous attempts at increasing the speed of a communication channel. A common approach is to package multiple serial interfaces together, but such systems have a high latency inherent to serial communication and suffer from significant losses from framing the data to determine the time sequence of the data words or packets.

Other attempts at producing high speed channels have focussed on controlling the production process to the maximum possible performance out of a particular process. For example, RAMBUS have specified an impedance for all components within a channel of 28 Ohms±5%. Such tight control is extremely difficult to maintain in a high speed system and attempts to do so are very expensive.

It is the object of the current invention to measure time relationships within a channel as a function of the data that is transmitted or the composition and environment of the channel, then to apply this information to establish a communication channel operating at high speed with very low timing uncertainty.

It is a further object of the current invention that the channel relaxes the production tolerances needed for its implementation by virtue of the system adapting to the environment in which it operates.

Another object of the present invention is to make the distribution of timing uncertainties narrower.

BRIEF SUMMARY OF THE INVENTION

The invention relates to the measurement of the relationship between time offsets and phase noise in the receiving channel at a plurality of frequencies or with a plurality of data patterns, and to apply these time offsets to compensate either at the receiver or the transmitter for differences between the actual channel and the idealised channel. The invention further concerns the reduction in the timing uncertainty in a circuit involving registers.

In one aspect, the invention is a means to measure the timing characteristic of the channel and to apply time offsets to data that compensate for the skew between the different signals that form the communication channel comprising at least one register and at least one variable delay element.

Thus, a data transmission apparatus is proposed for high-speed transmission of digital data, the means comprising:

a communicational channel between at least one transmitter having one or more registers for transmitting a signal along the communication channel, and at least one receiver having one or more registers for receiving the signal;

a main clock for generating a main clock signal for said transmitter's register(s); and a reference clock for generating reference signals for calibrating said receiver's register(s); said reference clock being associated with said main clock;

a means for measuring time offsets between different signals that form the communication channel, at different frequencies and/or for different data patterns transmitted through the channel;

a storage means for recording and storing the measured time offsets; and a timing correction means for applying the measured time offsets to compensate for inter signal skew by performing relative alignment of the measured offsets to a main clock edge.

Preferably, a transmission means according to the invention comprises a pipeline of elements each of which determines the timing effect for a specific group of physical phenomena, and then applies time offsets to the data to compensate for the effect of these phenomena as a function of the data and of past data. These phenomena include various transmission line effects, such as different propagation time in transmission lines and registers, cross-talk effect, inter-symbol interference, etc.

Preferably, each storage means comprises a set of look-up tables, wherein one look-up table can be allocated per signal wire, or across adjacent signal wires, or across all signal wires.

Preferably also, each transmitter's register is further connected to a vernier delay, the value of the delay being determined as a function of delay values in each of the look-up-tables that relates to that signal wire.

Preferably, each of said timing correction means is pre-calibrated by varying a calibration frequency.

Preferably, the timing correction means is chosen from variable delay, programmable delay, analogue vernier, digital vernier.

In another aspect, the invention measures the timing characteristics of the compensating electronics and idealises the compensating electronics by establishing offsets between the actual performance of the electronics and their idealised performance.

Thus, a method is provided for automatic skew calibration of a transmission means for high-speed transmission of digital data, the means comprising a communication channel, a transmitter and a receiver, the method comprising the steps of:

calibrating registers of the receiver in relation to a reference clock edge;

calibrating propagation delays of registers of the transmitter, using the calibrated registers of the receiver, wherein the calibration is performed by measuring time offsets between different signals that form the communication channel, for a plurality of frequencies, and/or for a plurality of data patterns, and applying the measured time offsets to compensate for inter-signal skew by performing relative alignment of the measured offsets to a main clock edge.

The time offsets are determined for each different physical effect and then the obtained time offsets are applied to the data to compensate for this particular effect as a function of the current data and previous data. It shall be mentioned that only combination of measurements performed at different frequencies and for different data patterns provides effective compensation of the timing uncertainties in a communication channel.

BRIEF DESCRIPTION OF THE SEVERAL VIEWS OF THE DRAWING

For a better understanding of the present invention and the advantages thereof and to show how the same may be carried into effect, reference will now be made, by way of example, without loss of generality, to the following description now taken in conjunction with the accompanying drawings in which.

DETAILED DESCRIPTION OF THE INVENTION

Figure 1:
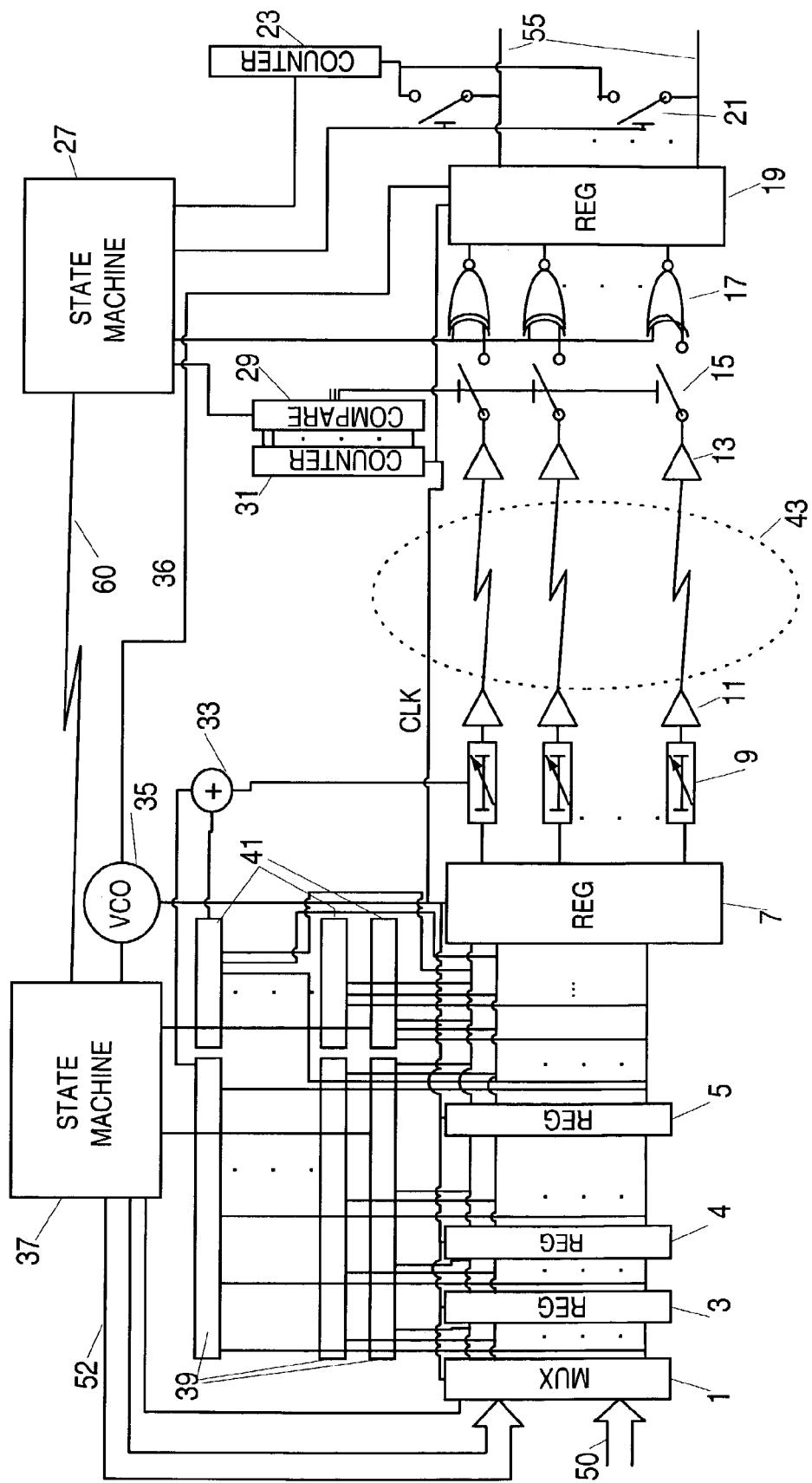
FIG. 1 shows a general block diagram of a data transmission means with timing uncertainty reduction according to the present invention.

In FIG. 1, an example embodiment of the present invention is illustrated in its most general form. As shown in the figure, the data 50 is presented as a plurality of signal wires into a multiplexer 1, which is controlled by a master state machine 37 such that it can select either the incoming data 50 or calibration data 52.

The data selected in the MUX then passes through a pipeline of registers 3, 4 and 5: only three pipe stages are shown but the number of pipe stages is preferably twice the number of symbols that are stored in the transmission medium 43 due to the propagation delay of the medium. The pipe finishes in a register 7 which may or may not be part of the monitoring pipe, depending on the access time of the content addressable memories 39 and 41, plus the summation time 33, plus the write time to the verniers 9. The pipe feeds two sets of Look Up Tables (LUTs), one which allocates one LUT 39 per signal wire, and the second LUT 41 which is allocated across adjacent signal wires or in the ultimate case, all signal wires. This technique is described in detail in U.S. Provisional applications No. 60/244,179 "Pattern Dependent Driver", filed on Oct. 31, 2001, and U.S. No. 60/310,299 "Transmitter circuit comprising timing deskewing means" filed on Aug. 06, 2001.

The purpose of the first LUT 39, is to use the data being sent to look up a correction value which is written into the LUT by the State Machine 37 during or at the end of the calibration process to correct for inter-symbol delays.

The purpose of the second LUT 41 is to use the data being sent to look up a correction value which is written into the LUT by the State Machine 37 during or at the end of the calibration process to correct for cross-talk and other effects which affect neighbouring signals.

To obtain correction values to be stored in LUTs, different data patterns are run in the system shown in FIG. 1, and the results are calculated as described in detail further with reference to calibration procedure. The results may be stored for different frequencies, or for a preferred frequency for a particular application.

The register 7 at the end of the pipe and the receiving register 19 should have low variations with temperature and other factors, such as by using self-compensating registers as described by PCT/RU00/00188. In the case of this embodiment, the filters described in PCT/RU00/00188 and in some cases the vernier delay, are more easily implemented as digital processes. For example, the low pass filter and integrator may be implemented as a counter or a digital filter and integrator, and the vernier that corrects for the offset in the register may be a digital vernier.

The output of the transmitter register 7 feeds into a bank of vernier delays, with the delay setting determined by the composition, for example, such as by the summation of the delay values in each of the LUTs that relate to that signal wire. In the figure only one summation unit 33 is shown for reasons of clarity but each pair of LUTs 39 and 41 has a summation unit which feeds in an similar fashion to the appropriate vernier.

The verniers delay the signals being sent into the transmission line 43 via buffers or drivers 11.

The verniers may be located at the far end as an alternative to or in addition to locating them at the transmitting end.

At the receiving end, the signal may be buffered by buffers 13, then pass through a switch and an EXOR gate which is used in the calibration process, into a receiving register 19. The purpose of the gate 15 shown in idealised form in FIG. 1 is to apply a data pattern mask for one edge in a plurality of edges in a pattern, i.e. place a time window on the data during calibration so that the effect of timing anomalies can be determined for each bit of a known data stream. The gates 15 may be NOR gates or NAND gates or any other gating function that has the functional equivalence of a switch. The EXOR gates 17 are needed in some implementations to invert the incoming data stream. Any other form of selective inversion may be used.

The data, after being latched by the receiving register 19, enters the system for use as a data channel 55, but may also be switched to a counter 23. An analogue alternative to the counter is a low pass filter and integrator.

The output of the counter is fed into a receiving State Machine 27. This same state machine controls the gating of data during a calibration process, such as by the use of a counter 31 and comparator 29 which is operated synchronously to gate in a specific data bit from a serial stream to the register 19 and gate out data bits that are not of interest in a particular calibration step.

The second or Slave State Machine 27 can communicate with the Master State Machine 37 either using the communication channel in a transceiver mode or using additional wires 60. The speed of this communication between state machines is very low in comparison with the data rate of the channel and latency is not of significant interest so any type of communication channel can be used for this connection between the state machines. The master State Machine 37 controls the system clock using a source of a periodic signal of a variable precision frequency 35, for example a frequency synthesiser comprising VCO, divider chains, stable frequency reference and phase comparator such as a Synergy SY89S429. Alternatively or in conjunction with the variable frequency source, the master State Machine controls the data pattern during calibration 52.

The two state machines form a feedback loop.

The state machines together run an algorithm which uses the method described in PCT/RU99/00194 whereby different frequencies or data patterns are used to determine the time between two edge events in terms of the actual delay of logic elements. In this process, a voltage controlled oscillator 35 is preferred.

The LUTs are each of a very small size, for example 3 bits or five bits wide in their address for the LUTs that correct for cross talk and twice as long in address as the number of bits in the transmission medium, for example 10 bits in a processor to memory interface application running at 5 G transfers per second across a 128 bit wide interface. The delay variation can be for example 6 bits or 8 bits, so the total amount of memory need in this application is low and the area taken by this memory in silicon is tiny. Hence a memory 3 bits wide with 6 bits of data at each address, is only 18 bits. For a 128 bit wide interface, this memory is less than 2K bits for the entire interface. The number of bits for the inter-symbol delay correction is typically twice this. For long cable applications, the data and its correction can be folded, avoiding what would otherwise be an exponential increase in the amount of memory as a function of the length of the transmission line.

In the case of channels with line lengths too long to make it practical or economic to store correction factors per symbol, it is possible to use instead of the LUTs, memories storing information on the reflections. For example, the current symbol would have to be shifted in time as a function of the previous symbol and the sum of the reflected energy. The inverse of the time delay caused by the reflected energy would be summed with the time offset of the symbol. This computation may be performed in an iterative manner or from a matrix of stored coefficients. The memories store the effect or the adjustment factors to compensate for phenomena such as reflections from a predetermined number of reflection nodes and the number of symbols between each of these nodes to determine when to apply each adjustment factor.

The LUTs are simply normal memory devices or structures where a short address is used to index a delay value.

The transmission medium can be any material including conducting wires, optical fibres, or any other medium. In the case of optical communications, there is negligible cross coupling and reflections can be ignored in many instances. This leaves the effect of the driver and receiver, which can be reduced to the difference in transmission between two symbols, as well as the skew thereof. The skew in the fibre is no longer pattern dependent from data line to data line, but still requires correction. The methods used currently involve passing all possible patterns into the channel and measuring the response. The present invention makes possible a much more accurate correction based on the actual temporal characteristics of the components and their interconnect.

Operation

The operation of this system shall now be described in detail. The field of the present invention is highly specialised and even those familiar with the art may be unaware of all of the effects and limitations involved in the implementation so to clarify these areas, the following briefing material is provided to aid the reader to understand the significance and true operation of the current invention along with indicative data relating to typical implementations, without prejudice or limit to the description of the invention. Moreover there is a difference in the way different specialists in the art use the terms, some using a term with more general application than others so the terms will also be defined again without prejudice to the description of the invention.

The practical capacity of the channel is a function of the maximum toggle rate of the registers, the skew of the data, the variation in the clock to output delay of the transmitter and variation in the setup and hold time for the receivers.

The use of self calibrating registers can reduce or eliminate variations in the clock to output delay and in the setup and hold time of registers. This leaves the skew and the toggle rate as the temporal limits on the speed of a communication channel.

The actual achievable toggle rate of a register or its maximum clock frequency has inherent to it a number of factors: the setup and hold time, the location and width of the phase noise distribution as well as various propagation and switching delays. If all other factors are removed, the toggle rate is the time it takes for a pulse to propagate around the gates of the feedback loop in the register. If the variations in factors such as the setup and hold time are reduced or eliminated, such as by the use of self-compensating registers, then the maximum toggle rate can be equivalent to between four and six gate delays. As gate delays reduce as the square of reductions in feature size, we can estimate the toggle rate for registers will increase as shown in table below.

| Feature size (nm) | Gate delay(ps) | Toggle rate (GHz) |
| --- | --- | --- |
| 300 | 150 | 1.1 |
| 180 | 54 | 3.1 |
| 130 | 28 | 5.9 |
| 70 | 8 | 20.4 |

All numeric values given in these examples are given for CMOS technology, as this is the most widely available and lowest cost solution for the implementation of any communications channel. Other technologies such as GaAs or InPh (Indium Phosphide) have a different switching rate: their higher electron mobility will enable them to switch faster, hence toggle rates can be several times faster for the same feature size.

The primary difference between technologies, that affect the maximum rate of the communication channel using the present invention, is their relative switching speed. To scale from CMOS to, for example, GaAs at the same feature size, one need only multiply the maximum frequency of switching speed related limits by the ratio of the electron mobilities. For example, the toggle frequency of a GaAs device fabricated in a 300 nm feature size technology should be around 3.1 GHz instead of 1.1 GHz for the equivalent CMOS device. However not all the limits to switching speed scale evenly and these limits would reduce some of the advantages of esoteric materials over CMOS.

Given that the toggle rate is predetermined by the fabrication process and that the effect of variations of setup and hold time can be eliminated, this leaves the signal skew as the primary limiting factor in the capacity of a channel and it is this limit that the present invention addresses.

The factors that determine skew are:

1. Variations in the sample and hold time or clock to output time of different bits and different registers in a wide channel.

2. Cross talk. For example if a signal's neighbours move in the opposite direction to the signal, then the slew rate for the signal is lower than if its neighbours carry transitions of the same direction.

3. Impedance mismatch. As each bit passes a discontinuity, a portion of the incident energy is reflected. This changes the forward slew rate as it reduces the value of the forward voltage, and the energy thus subtracted is then added to each successive symbol in the transmission medium until the reflection is absorbed by terminating components or other damping means. Thus an impedance discontinuity causes a skew on a signal with respect to a reference.

4. Electrical noise. This has a similar effect to the impedance discontinuity in adding energy to the signal, which can either increase or decrease its momentary voltage or current, causing a change in the time for that signal to cross a predetermined threshold value used for switching. The noise has many sources and combines pink and white noise profiles.

5. Skin effects cause the higher frequency components of a signal to be attenuated due to the resistance increasing as a square root of the frequency, for frequencies above a knee.

6. Charge storage in the driver and receiver causes a difference in the time taken to slew a signal as a function of the preceding data, that is, it creates intersymbol timing uncertainty.

7. The dielectric coefficients of the transmission medium being non-linear with frequency at extremely high frequencies. This means that the impedance discontinuities referred to earlier are frequency selective and cause the signal to skew additionally as a function of the preceding data.

Figure 4:
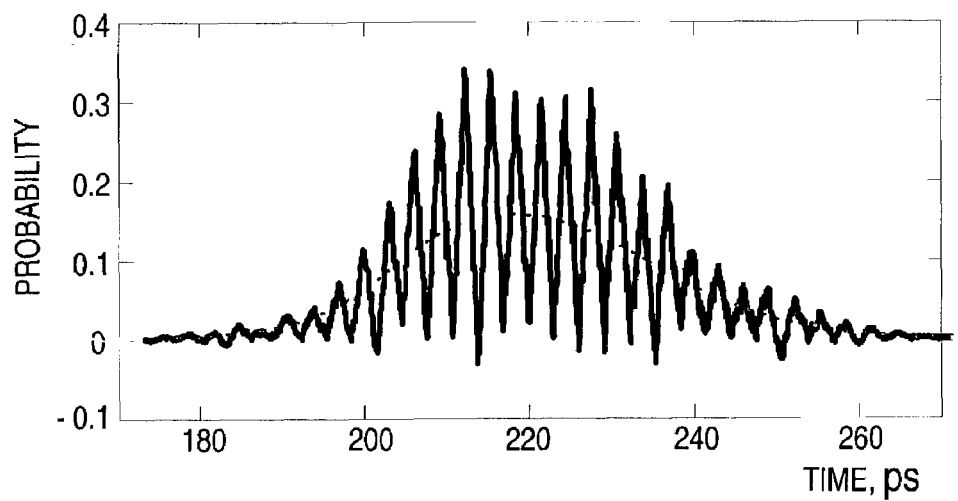
FIG. 4 shows an example of the phase noise characteristic both ideal and with the effect of low frequency physical phenomena.

8. Second order effects, many of which can be mitigated by good circuit design. Other second order effects are power supply noise, thermal variations, ageing, even the air flow turbulence. FIG. 4 shows one of these such second order effects causing a phase delay with a periodicity of 1 KHz. The emphasis here is that the engineer must take into account all environmental factors that may impinge on the performance and compensate for these using good circuit techniques and appropriate feedback loop characteristics.

Each one of the factors described above has an effect on the probability of a bit being received correctly. In the design of a channel these effects are analysed for their distribution and the degree of correction needed and the resolution of that correction is determined. This process will now be described in more detail.

Figure 2:
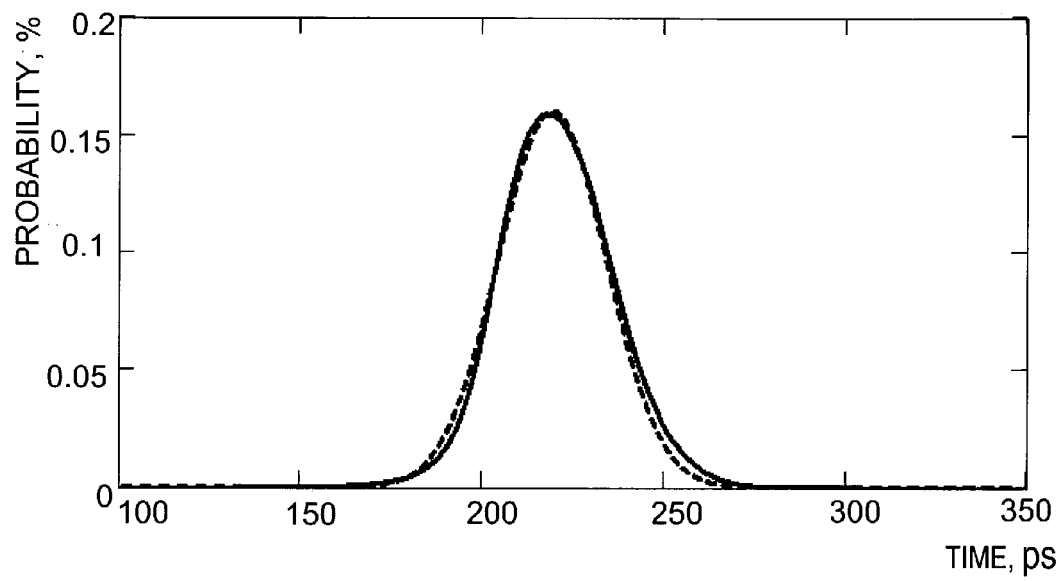
FIG. 2 shows the phase noise characteristic, both ideal and actual for a common component, a SSTL16857 register with input noise, with relative time in pico seconds in the X axis and probability density of receiving the wrong bit with a scaling factor in the Y axis.
Figure 3:
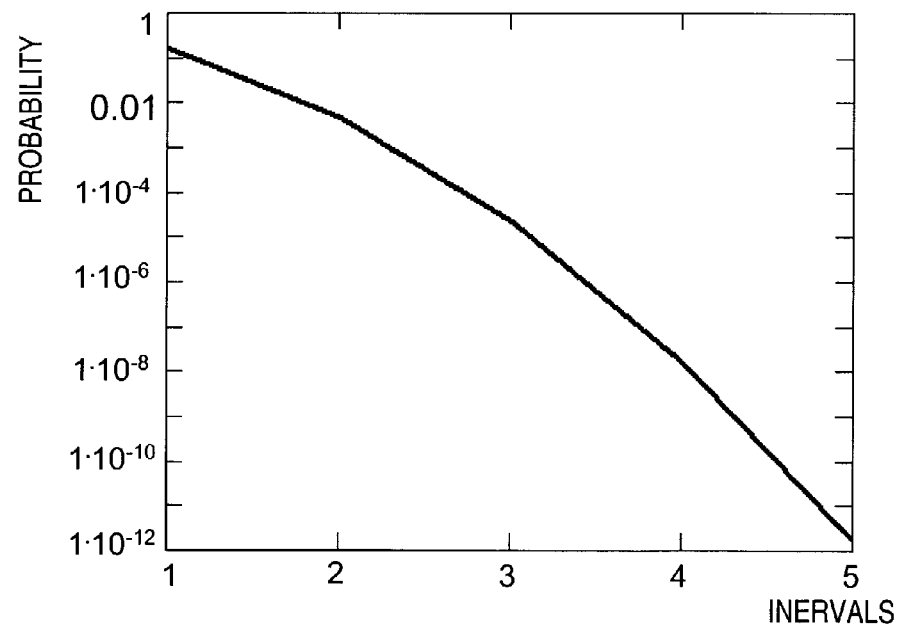
FIG. 3 shows the Bit Error Rate (BER) as a function of the number of standard deviations of a normal distribution, from which a temporal operating window is chosen.

All registers have a probability density distribution for the register being in a 0 or a 1 state as a function of the time offset of the clock to data. FIG. 2 shows the actual probability density distribution for one such register, an SSTL register: the dotted line is the closest fit of a Normal distribution, the solid line represents measurements taken at sub-pico second accuracy and resolution.

The BER contribution from a component can be measured from the timing uncertainty distribution curve for the component. The communication channel operates with a predetermined time window around when the transition occurs.

Figure 5:
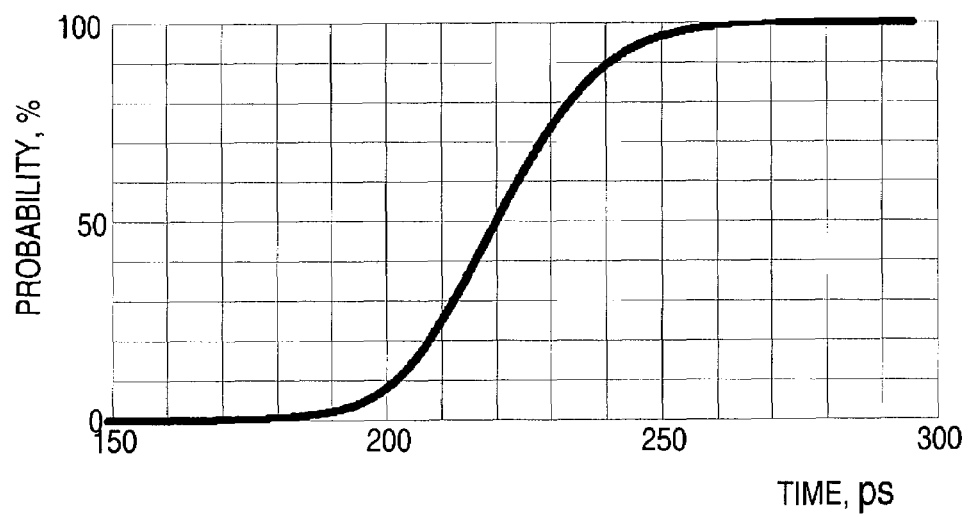
FIG. 5 shows an example of the probability of a signal being latched as a 1 by a register as a function of a timing offset.
Figure 6:
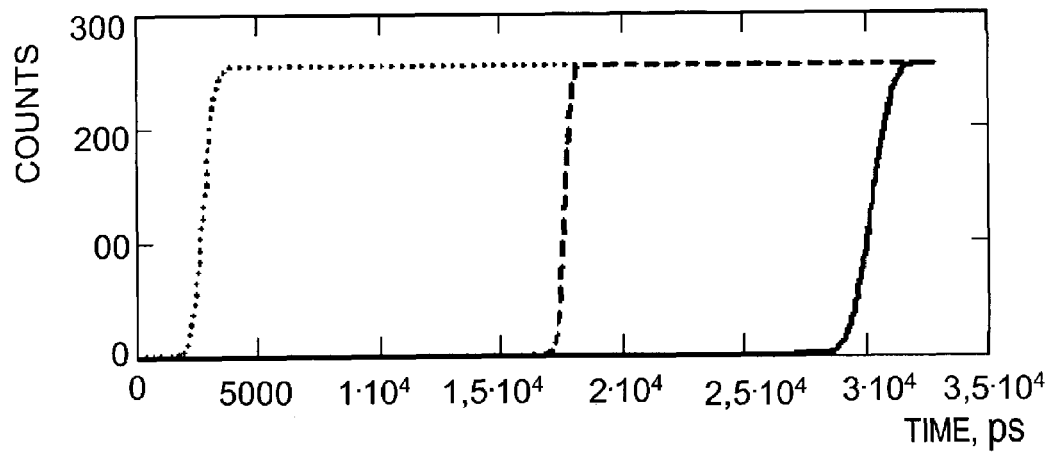
FIG. 6 shows an example of a variation in the probability of a signal being latched as a 1 as a function of the data, namely the frequency at which the data changes.
Figure 7:
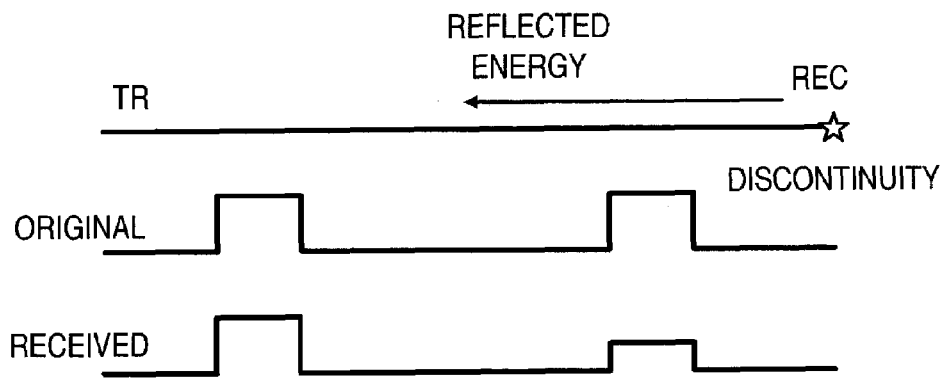
FIG. 7 shows an example of the effect of a reflection, in the transmission line connecting two devices, on the data that follows a particular bit.

Consider FIG. 5, which shows the time of a transition of an SSTL16857 register, measured with an accuracy of a fraction of a pico second, against the probability of the signal being latched as a 0 or a 1. The Standard Deviation on the transition point on this register is 20 ps. If this register is used in a communication channel with it latching data every 200 ps (20 ps×2, ×5 sigmas), the BER from this component will be $1.5 \times 10^{-12}$. It is by a determination of this nature that the number of steps in the calibration process and the accuracy needed in that process is determined.

The BER of a single data path or line within a channel for a given data rate can be calculated by taking the timing uncertainty distribution curve for every component both along a line of a channel taking the square root from the sum of the squares of the RMS of the distributions, to arrive at a distribution curve for the line as a whole. The channel BER is the sum of the BERs of each line. The BER is one minus the integral of this curve, as tabulated in FIG. 4. The tighter the distribution for each component of the channel, then the lower the BER at any given frequency, or the higher the frequency at which the channel can operate.

For each of the effects that are not being compensated, the distributions are summed by the RMS of their distributions, the root is taken and an overall distribution is determined. From this the frequency at which data can be sent reliably is determined and the number of steps in the verniers is chosen.

It is necessary for the accurate and unambiguous description of the operation of the present invention to clarify what the Setup and Hold times of the registers mean.

Setup and Hold time is the total time covering all variations in the phase noise maxima from part to part, from DQ to DQ, with variations in temperature, process variation and power supply voltage plus any settling time. In a receiver the whole actual Setup and Hold period is relevant. In a transmitter the clock to data output delay is considered rather than the Setup and Hold term of the register, again with variations that arise as a result of changes of temperature, phase noise and fabrication tolerances.

Registers may exhibit true metastability where the register exhibits an exponential increase in the clock to output time as a particular clocking point is approached or they may simply exhibit phase noise. The registers in the present invention are clocked at a high speed, so whether the register is metastable is immaterial: the next clock cycle resolves the metastable state. Metastability manifests itself as phase noise in this context. See "Metastability and the ECLinPS Family" by Rennie Wm. Dover and Todd Peason, AN1504, Motorola Inc., 1996; and also "High-Speed Digital Design" by Howard W. Johnson and Martin Graham, Prentice Hall, 1993, Englewood Cliffs, N.J. 17632.

The time window in which there is a significant probability of metastability, or the time window in which there is significant phase noise in a register, is normally very small, but the variation in this time gives rise to very large brackets which are expressed as long setup and hold times or clock to output delays.

The present invention applies the phase noise to a feedback system to control the channel, ensuring it operates on or close to its region of maximal stability, this being 180 degrees out of phase from the peak of the phase noise distribution.

Use of the current invention and those already referenced herein by the present inventors, namely PCT/RU99/00194 and PCT/RU00/00188 has enabled the inventors to take measurements of phase noise distributions with accuracies of fempto-seconds and even atto-seconds. The information from this analysis is described here to explain how the calibration process used by the present invention operates.

The width of the true phase noise distribution is the comparable to the phase noise of a sample-hold function implemented in the same technology with the same charge storage, assuming all drift in that function is controlled, for example, by the use of self-calibrating registers as in PCT/RU00/00188.

Figure 8:
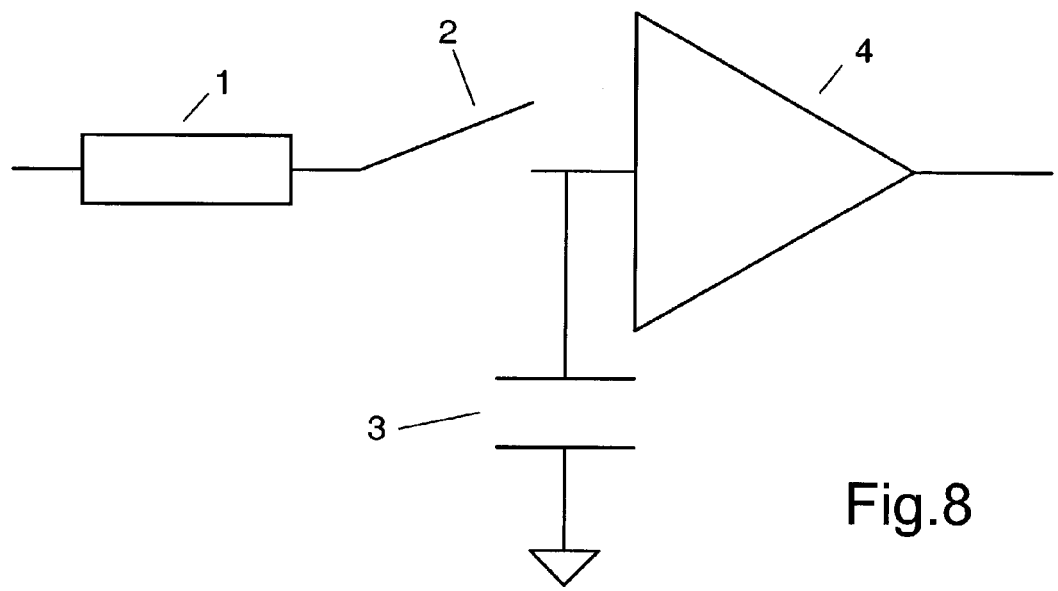
FIG. 8 shows a simple sample—hold circuit.

A sample-hold circuit such as that shown in FIG. 8 comprises a gate driving a capacitor, followed by a buffer. The uncertainty in opening the gate is a function of the slew rate of the HOLD signal, the noise on the HOLD signal, the gain of the gating transistor and the switching speed of the gate. This effect is not metastability at all: it is simply the sampling of a signal which is undefined in time by the noise distribution on the HOLD line and gating transistor. In the case of the sample and hold circuit, the timing uncertainty comes from noise in any input buffer, noise in any command line buffer to the gate, and particularly the gating transistor switching time.

This means that when we measure the phase noise characteristics of a register, we are actually measuring the switching time characteristics for the internal circuitry that comprises the register plus input noise.

The phase noise distribution, appears to manifest a slightly less than linear reduction in the time domain as a function of reducing feature size. If one estimates the resulting function as a reduction proportional to the ratio of feature sizes to a power of 0.75, then the Standard Deviation for the timing uncertainty is expected to reduce from around 20 ps to 12 ps as technology moves from 300 nm to 70 nm.

| Feature size (nm) | Standard Deviation of Timing uncertainty window (ps) |
| --- | --- |
| 300 | 20 |
| 180 | 14 |
| 130 | 11 |
| 70 | 7 |

Taking the 70 nm process, and operating with Sigma 6 BERs, the fastest data rate that can be supported is a transition every 42 ns. This is the ultimate rate of data transmission for a serial interface with clock recovery, or for each bit of a parallel system where all skew is completely eliminated.

Operating at a higher BER would allow a higher data rate. For example using Viterbi encoding and decoding of each data line could allow the system to operate at Sigma 4 BERs per bit in the extreme case (the data rate being half this, ie Sigma 2, ie error every 200 bits—at the limit of the range that is easily correctable), which would mean the the maximum data rate is a change every 28 ps, or just over 35 GHz.

In the examples shown in FIG. 1 and FIG. 2, the time window for the register in a channel which is, for all useful purposes, free of errors, would be 210 ps (6 Sigma).

Without the techniques such as described in PCT/RU00/00188, the phase noise of the register would have two components: the position of its maxima, and the window around the phase noise maxima. The register without any means of controlling the position of the phase noise maximum could take data at less than 500 MHz, even if it arrived without skew.

The Operation of the present invention involves two steps:
1. Calibration
2. Data transfer.

The Calibration step uses the method as described in PCT/RU98/00204 to determine the time delay between the transition of a clock signal and the registering of a data signal in a register, particularly register 19 in FIG. 1.

The present invention preferably uses three calibration passes, one to measure the characteristics of the registers, verniers and other components, for at least two different frequencies, another pass to measure the total intersymbol delay for different data patterns, i.e. for each combination of symbols that is in the pipe comprising registers 3, 4 and 5 in FIG. 1, this being ideally at least twice the number of symbols that are in transit in the transmission medium 43, or preferably for each of the nodes causing changes in intersymbol delay as this has a much lower latency. The third pass is to determine the cross talk effects on signal delay, also for different data patterns. Obviously in any one implementation it is possible to reduce each one of these passes or combine them.

The current invention implements the process described in PCT/RU98/00204 to determine the time delays with very high accuracy, for example an application may chose to measure the time delays to ten pico-second accuracy, another very exacting application may require fempto-second accuracy.

The key step of the present invention in the calibration process is to gate specific symbols using gates 15 in FIG. 1, which enables both the intersymbol delays for specific patterns of data, and also delays due to cross talk, to be measured. This information may be applied to correct the delay of the symbol, or preferably to determine the effect of the reflection coefficients in the medium and to compensate for these as a function of the present symbol, the last symbol (to determine the direction of the transition) and the sum of the previous reflections.

To measure the delay for a specific symbol, it may be necessary to invert that signal, for example by using EXOR gates 17.

The master state machine pass information on which symbol should be gated from the master state machine to the second state machine: each state machine may be a small processor or microcontroller such as an ARM chip or it may be a series of Finite State Machines. The second state machine applies the appropriate gating or inversion of the signal, selects the appropriate bit line, routes the signal via gates 21 to a means for determining the proportion of the signal that causes a 1 logic state or 0 logic state in a binary system, for example an up/down counter or a low pass filter to average the voltage on the bit line being monitored followed by an integrator. The master state machine changes the frequency or data pattern of the calibration data and reads the counter contents, or its equivalent, to determine the proportion of bits that are in each logic state. The master state machine then changes the delay within the delay vernier 9, to cause the data bit to switch at the correct point in time.

The use of two or more frequencies to calibrate delay values is known from PCT/RU99/00194. To resolve the unknown variables according to the present invention, the change in frequency is chosen as the preferred reference means because the frequency of timing sources can be set extremely accurately in a frequency synthesiser.

Once the delay values are known for a particular combination of bits, the values are written to the appropriate LUT: the LUT depends on which variables are altered and the data pattern being generated by the state machine.

This first mode of operation is preferably carried out during the system reset phase and but may be repeated. In a preferred embodiment, the LUT may have two parts, one being a non-volatile memory, the second being volatile memory, such that the entire calibration may be done only once at the end of the manufacturing process, but a fine tuning over a much smaller range is performed during power up. In some cases it is possible to perform the calibration only once, then use the calibration data throughout the life of the product.

The second mode of operation for the present invention is to send the data.

For each data word, the delay of the present bit is calculated by the master state machine applying a repetitive sequence and the symbol of interest being gated out.

It is necessary for the calibration process to first determine which symbol is which, as the delay in the transmission line is unknown at the outset. This can be achieved by various techniques, among the simplest being to send a clock signal down all data lines at a rate low enough to exceed the total timing uncertainty distribution curve with the required accuracy, for example using Sigma 4 with averaging or Sigma 6 without. For example, a system with a composite probability distribution for the receipt of a bit of 1 ns, could initiate the calibration process by using a data stream with an equivalent frequency of 96 MHz, using this frequency and 60 MHz not to determine the total loop delay but to set a reference edge by which all other data bits can be measured. In this manner the position of each of the bits in time in the receiver relative to the transmitter can be determined.

Once the position of a reference edge has been determined by the above process, the position of other bits in the stream can be determined by counting the clock cycles using a controlled counter and comparator, or using extra protocol information between the two state machines, or even by judicious selection of frequencies and data patterns for the calibration.

Where the access time of the LUTs is long, the transmitter register 7 may require to include more than one pipe delay.

The vernier delays are shown in the transmitter in this embodiment, but the delays can be in the receiver and the receiver can act as the master in the calibration process.

The method of determining the time in which a transition occurs will now be explained in further detail.

Consider a channel comprising simply of a set of drivers and a set of receivers.

The timing of each drive register and receiver register is controlled by a precision Vernier delay, for example with 20 ps resolution.

Figure 9:
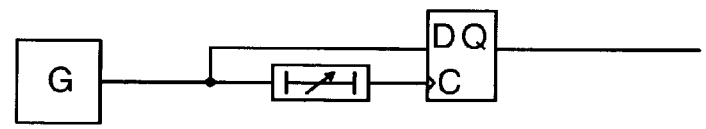
FIG. 9 shows a simplified delay calibration configuration.

The calibration procedure consists of the following steps:
1. Calibration of the Delay Verniers
2. Calibration of the Receiving Registers
3. Calibration of the Driving Registers
4. Adjustment of the Delay Verniers A simplified diagram of the skew-measuring configuration is shown in the FIG. 9, where the register is either an input or output register. In that figure, G is a Phase Locked Loop (PLL), variable over the range such as 1 GHz to 5 GHz. Phase jitter is typically less than 0.05%, and this is compensated during calibration.

All steps of the calibration procedure are based on the following skew-measuring equation:

$$T_D = T_0 + \tau * N$$

where $T_D$ is the Vernier delay, $T_0$ is the minimum delay, $\tau$ is the discrete interval of the delay settings and N is the programmed code.

Calibration Step 1

Figure 10:
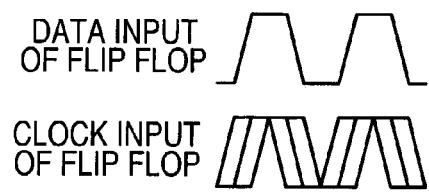
FIG. 10 is a timing diagram.

In the first step of the calibration process, the calibration of the Delay Verniers, the period of the PLL is set to a value less than the interval of the Delay Vernier, as shown in FIG. 10.

Note that while a PLL is used, this does not affect the measurement. The accuracy of the PLL depends on the accuracy of the quartz crystal resonant frequency, which is typically better than 1 in 100,000, and its own noise figure of less than 0.05%. As the calibration is performed at frequencies in the 100 MHz to 10 GHz region, this tolerance created by the frequency uncertainty and by jitter is many times less than the typical 20 ps to 1 ps resolution of the regulating Vernier delay.

Calibration Step 2

The value of the vernier delay is then scanned from its minimum to maximum, sampling the output of the flip-flop many times. This allows the point at which the flip-flop has a transition to be determined. At this point, $T_D$ will be equal to the period of the generator:

$$T_{D1}=P_1=T_0+\tau*N_1$$

Calibration Step 3

The period of the generator is then changed and the procedure described above repeated to find the next point where the flip-flop has a peak in its phase noise characteristic, that is the highest probability of the transition occurring within the register. Thus:

$$T_{D2}=P_2=T_0+\tau*N_2$$

After this step $T_0$ and $\tau$ can be easily calculated.

Repeating this procedure for each Delay Vernier allows all of them to be calibrated. In each measurement, there are many samples, such as 256. This increases the overall frequency accuracy by a further factor of the square root of the number of samples, for example by 16 (the square root of 256), so even a 20 ps resolution increases to a measurement accuracy of 1.25 ps overall.

Calibration Step 4

The receiving registers are then calibrated in the same way. Because the Delay Verniers are now precisely calibrated it is possible to find the difference in the timing of the peak of the phase noise for each receiving flip-flop individually.

Calibration Step 5

The driving registers are then calibrated using the previously calibrated Delay Verniers and receiving registers.

Calibration Step 6

The software compensation for differences in PCB trace lengths is added to the calibration results. This compensation uses the trace lengths taken from the actual PCB layout software and can be hard programmed or can be set in a non-volatile memory for the whole system, for example a serial presence detect memory device or integrated on the same chip as the communication channel.

Calibration Step 7

At the end of the calibration process the delays in the signals coming to a node and from the node for each bit have been measured.

The Delay Verniers can be adjusted in order to eliminate the part to part skew in the driving and receiving registers. Only the skew within the device is not compensated for, but because it has been measured it can be taken into account by the state machine software. This means that the entire system is calibrated with a total absolute accuracy of 20 ps, and relative accuracy of 1.25 ps accuracy if 256 samples are taken.

Precision registers can be used which have only a 10 ps window for the skew within the register, in which case the accuracy of the system using this technique on its own is 20 ps (the increment on the Delay Vernier). It is possible to reduce this error down to fempto second levels by oversampling, using basic sampling theory.

This process can be repeated to achieve higher levels of time accuracy, in particular when the time taken to transmit a bit is not known. This information is necessary to apply symbol by symbol selection and gating during the calibration process where this is used.

We claim:

1. A data transmission apparatus for high-speed transmission of digital data comprising
    a communicational channel between at least one transmitter having one or more registers for transmitting a signal along the communication channel, and at least one receiver having one or more registers for receiving the signal;
    a main clock for generating a main clock signal for said transmitter's register(s); and a reference clock for generating reference signals for calibrating said receiver's register(s); said reference clock being associated with said main clock;
    a means for measuring time offsets between different signals that form the communication channel, at different frequencies, and/or for different data patterns transmitted through the channel;
    a storage means for recording and storing the measured time offsets; and
    a timing correction means for applying the measured time offsets to compensate for inter-signal skew by performing relative alignment of the measured offsets to the main clock edge.

2. The apparatus according to claim 1, wherein each of said timing correction means is pre-calibrated by varying a calibration frequency.

3. The apparatus according to claim 1, wherein said timing correction means is chosen from variable delay, programmable delay, analogue vernier, digital vernier.

4. The apparatus according to claim 1, wherein the timing correction means generates and applies a correction to the timing position of a signal transition between two logical levels, the correction being generated on the basis of the information stored in the storage means.

5. The apparatus according to claim 1, wherein the timing correction means comprises a pipeline of registers, each of which determines time offset for a particular physical effect and then applies the obtained time offsets to the data to compensate for this effect as a function of the current data and previous data.

6. The apparatus according to claim 5, wherein the number of pipe stages of registers is twice the number of symbols that are stored in a transmission medium, to compensate signal reflections in transmission lines.

7. The apparatus according to claim 1, wherein the storage means comprises a set of look-up tables, one look-up table being allocated per signal wire.

8. The apparatus according to claim 1, wherein the storage means comprises a set of look-up tables, one look-up table being allocated across adjacent signal wires.

9. The apparatus according to claim 1, wherein the storage means comprises a set of look-up tables, one look-up table being allocated across all signal wires.

10. The apparatus according to claim 1, wherein each transmitter's register is further connected to a vernier delay, the value of delay being determined as a function of delay values in a respective look-up-table allocated to that signal wire.

11. The apparatus according to claim 1, wherein the time between the timing position of a signal transition between two logical levels, on one side, and the reference clock edge, on the other side, is determined in terms of the actual delay of logic elements.

12. A method for automatic skew calibration of a transmission apparatus for high-speed transmission of digital data, comprising a transmitter and a receiver, the method comprising the steps of:
    calibrating registers of the receiver in relation to a reference clock edge;
    calibrating propagation delays of registers of the transmitter, using the calibrated registers of the receiver,
    wherein the calibration is performed by
    measuring time offsets between different signals that form a communication channel, for a plurality of frequencies, or for a plurality of data patterns, and
    applying the measured time offsets to compensate for said inter-signal skew by performing relative alignment of the measured offsets to a main clock edge.

13. The method as claimed in claim 12, wherein the time offsets are determined for each different physical effect and then the obtained time offsets are applied to the data to compensate for this particular effect as a function of the current data and previous data.

14. The method according to claim 12, wherein the obtained time offsets are stored in a plurality of look-up tables.

15. The method as claimed in claim 12, wherein the time offset is determined as a function of delay values in each of the look-up-table that relates to that signal wire.

16. The method as claimed in claim 12, wherein the time offset is determined by summation of delay values in each of the look-up-table that relates to that signal wire.

17. The method as claimed in claim 12, wherein a data pattern mask is applied for one edge in a plurality of edges in a pattern.

18. The method as claimed in claim 12, wherein the time between the timing position of a signal transition between two logical levels, on one side, and the reference clock edge, on the other side, is determined in terms of the actual delay of logic elements.

19. The method as claimed in claim 12, wherein the time offset is calculated based on the only one data pattern stored, the time offsets for other data patterns being calculated on the basis of said time offset and correction factors for other data patterns.

20. The method as claimed in claim 19, wherein the correction factors are stored per each symbol.

* * * * *